(12) United States Patent
Sung et al.

(10) Patent No.: US 9,351,400 B1
(45) Date of Patent: May 24, 2016

(54) ELECTRICAL CONNECTIONS BETWEEN CONDUCTIVE CONTACTS

(71) Applicant: Apple Inc., Cupertino, CA (US)

(72) Inventors: Kuo-Hua Sung, Cupertino, CA (US);
Silvio Grespan, Cupertino, CA (US);
Brian Shadle, Cupertino, CA (US);
Romain A. Teil, San Francisco, CA (US); Michael B. Wittenberg, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/185,818

(22) Filed: Feb. 20, 2014

Related U.S. Application Data

(60) Provisional application No. 61/767,733, filed on Feb. 21, 2013.

(51) Int. Cl.
*H05K 1/03* (2006.01)
*H05K 1/11* (2006.01)
*H05K 1/09* (2006.01)
*H05K 3/40* (2006.01)

(52) U.S. Cl.
CPC .. *H05K 1/11* (2013.01); *H05K 1/03* (2013.01); *H05K 1/09* (2013.01); *H05K 3/40* (2013.01)

(58) Field of Classification Search
USPC .......................................... 174/255, 261, 257
See application file for complete search history.

(56) References Cited

U.S. PATENT DOCUMENTS

| | | | |
|---|---|---|---|
| 6,317,248 B1 | 11/2001 | Agrawal et al. | |
| 6,492,599 B1 | 12/2002 | Sugihara | |
| 6,690,032 B1 | 2/2004 | Umetsu | |
| 7,211,885 B2 | 5/2007 | Nordal et | |
| 7,898,719 B2 | 3/2011 | Schofield et al. | |
| 8,547,350 B2 | 10/2013 | Anglin et al. | |
| 2003/0174272 A1* | 9/2003 | Shirato et al. | 349/149 |
| 2007/0148829 A1* | 6/2007 | Yoshino et al. | 438/128 |
| 2011/0102719 A1 | 5/2011 | Kakehi et al. | |
| 2011/0186336 A1* | 8/2011 | Nakayama | 174/255 |
| 2012/0038577 A1 | 2/2012 | Brown et al. | |

FOREIGN PATENT DOCUMENTS

EP 2328015 6/2011

OTHER PUBLICATIONS

Bau, et al., "TeslaTouch: Electrovibration for Touch Surfaces," UIST'10, Oct. 3-6, 2010, New York, New York USA, 10 pages.
Feist, "Samsung snags patent for new pressure sensitive touchscreens," posted on AndroidAuthority.com at URL: http://www.androidauthority.com/samsung-patent-pressure-sensitive-touchscreens-354860, Mar. 7, 2014, 1 page.

\* cited by examiner

*Primary Examiner* — Andargie M Aychillhum
(74) *Attorney, Agent, or Firm* — Brownstein Hyatt Farber Schreck, LLP

(57) ABSTRACT

Conductive contacts can be disposed on multiple substrates or on different surfaces of a single substrate. Conductive material is disposed over at least a portion of the two conductive contacts to electrically connect the contacts. The conductive material may be disposed over at least one surface between the conductive contacts. One or more conductive borders can be formed on a surface of a conductive layer. The conductive border or borders can improve signal transmission across the surface of the conductive layer.

17 Claims, 8 Drawing Sheets

ELECTRICAL CONNECTIONS BETWEEN CONDUCTIVE CONTACTS

TECHNICAL FIELD

The present invention relates generally to electronic devices, and more specifically to electrical connections in electronic devices.

BACKGROUND

Electronic devices, such as smartphones and computers, include devices formed with one or more substrates or layers. For example, a display in a smartphone can include a display stack formed with multiple layers. The layers can include a cover glass, a polarizer, a conductive layer, a color filter, and a display layer. Conductive contacts, such as, for example, contact pads can be used to transmit electrical signals to and from various components on a layer or to a layer itself.

FIG. 1 illustrates an electrical connection between conductive contacts on two substrates. A conductive contact 100 is disposed on the front surface of a substrate 102 and another conductive contact 104 is disposed on a back surface of another substrate 106, although in some situations the contacts may be disposed on the front and back of the same substrate. A flexible cable 108 is used to form an electrical connection between the conductive contacts 100, 104. The flexible cable has a bend radius that limits how sharp the bend in the flexible cable can be between the two conductive contacts 100, 104. Due at least in part to its bend radius, the flexible cable can consume considerable area in an electronic device. The amount of area consumed by the flexible cable can be an issue when the size of the electronic device is small.

Additionally, the bend in the flexible cable can produce cracks in one or more conductive traces included in the flexible cable. The cracks can be created when the flexible cable is first bent or the cracks can develop over time. Either way, the cracks in the conductive traces can prevent electrical signals from being transmitted through the entire length of the flexible cable, which can render the electronic device inoperable.

SUMMARY

In one aspect, an electronic device can include a substrate that has a first conductive contact disposed on a first surface of the substrate and a second conductive contact disposed on a second surface of the substrate. Conductive material is disposed on at least a portion of the first and second conductive contacts to electrically connect the conductive contacts. The conductive material may be disposed over or on at least one surface between the contact surfaces of the conductive contacts. Insulating material can be formed over the conductive material to isolate the electrical connection.

In another aspect, an electronic device can include a first substrate having a first conductive contact disposed on a surface of the first substrate and a second substrate having a second conductive contact disposed on a surface of the second substrate. The second substrate may be positioned below the first substrate. Conductive material is disposed on at least a portion of the first and second conductive contacts to electrically connect the conductive contacts. In some embodiments, the conductive material may also be disposed on or over at least one surface between the contact surfaces of the first and second conductive contacts. Insulating material can be formed over the conductive material to isolate the electrical connection. As one example, the first substrate may be a display layer and the second substrate a transparent conductive layer disposed below the display layer. One conductive contact is disposed on a front surface of the display layer and the other conductive contact on a back surface of the transparent conductive layer. The conductive material can be implemented with any suitable conductive material or combination of materials, including, but not limited to, metal, silver nanowire, and conductive nanoparticles.

In another aspect, a method for forming an electrical connection between conductive contacts disposed on different surfaces of at least one substrate includes forming a conductive material on at least a portion of the conductive contacts to electrically connect the conductive contacts. The conductive material may be disposed on or over one or more surfaces between the contact surfaces of the conductive contacts. Insulating material can be formed over the conductive material to isolate the electrical connection.

In another aspect, a method for forming an electrical connection between a first conductive contact disposed on a front surface of a first substrate and a second conductive contact disposed on a back surface of a second substrate disposed below the first substrate includes forming a conductive material on at least a portion of the conductive contacts to electrically connect the conductive contacts. In some embodiments, the conductive material may be disposed over or on at least one surface between each contact surface of the conductive contacts. Insulating material can be formed over the conductive material to isolate the electrical connection.

In another aspect, one or more conductive borders can be formed on at least a portion of a surface of a conductive layer. The conductive border(s) can improve signal transmission across the surface of the conductive layer. In one embodiment, at least one conductive border may be formed along a perimeter edge of the conductive layer. The conductive border or borders can be formed using any suitable fabrication method and any suitable material or combination of materials, can be opaque or transparent, and can be formed into any desired shape or shapes. In one embodiment, at least one conductive border can have a lower impedance than the material(s) used to form the conductive layer.

BRIEF DESCRIPTION OF THE DRAWINGS

Embodiments are better understood with reference to the following drawings. The elements of the drawings are not necessarily to scale relative to each other. Identical reference numerals have been used, where possible, to designate identical features that are common to the figures.

DETAILED DESCRIPTION

Figure 1:
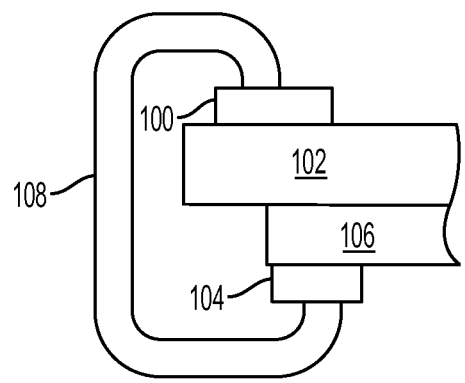
FIG. 1 illustrates an electrical connection between conductive contacts on two substrates in accordance with the prior art.

Embodiments described herein may provide an electrical connection between conductive contacts disposed on two different surfaces of a single substrate or on two or more substrates. As one example, first and second conductive contacts may be located on opposite sides of a substrate and connected to one another, in full or in part, by a conductive material. A conductive material may be disposed over at least portions of the conductive contacts to electrically connect the conductive contacts. In some embodiments, the conductive material also overlies, contacts, or is otherwise adjacent to an intervening edge of the substrate between the two contacts. The conductive material may be formed from metal, a conductive polymer, a mesh or nanowire, a ceramic, an impregnated resin and the like. The conductive contacts can be used to transmit a signal or signals to components disposed on or in a substrate, to conductive layers disposed over different surfaces of a single substrate, or to conductive layers disposed on two or more substrates. Additionally, a signal can be transmitted around one or more edges of the conductive layer using conductive material disposed along the edge or edges of the substrate. A substrate can be any type of substrate, including, but not limited to, a glass, plastic, printed circuit board, or flexible cable.

Throughout the specification and claims, the following terms take the meanings explicitly associated herein, unless the context clearly dictates otherwise. The meaning of "a", "an", and "the" includes plural reference, the meaning of "in" includes "in" and "on". The term "connected" means either a direct physical and/or electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terminology, such as "top", "bottom", "front", "back", "leading", "trailing", etc., is used with reference to the orientation of the Figure(s) being described. Because components of embodiments described herein can be positioned in a number of different orientations, the directional terminology is used for purposes of illustration only and is in no way limiting.

When used in conjunction with a substrate, a layer, substrates, or layers in an electrical device, such as the layers in a display stack included in an electronic device, the directional terminology is intended to be construed broadly, and therefore should not be interpreted to preclude the presence of one or more intervening layers or other intervening device features or elements. Thus, a given substrate or layer that is described herein as being formed on, formed over, disposed on, or disposed over another layer may be separated from the latter layer by one or more additional layers.

Further, the term "electronic device" is to be understood as any type of electronic device, including, but not limited to, a cell phone or smart phone, a tablet, a computing device, an integrated circuit, and a printed circuit board or boards.

Figure 2:
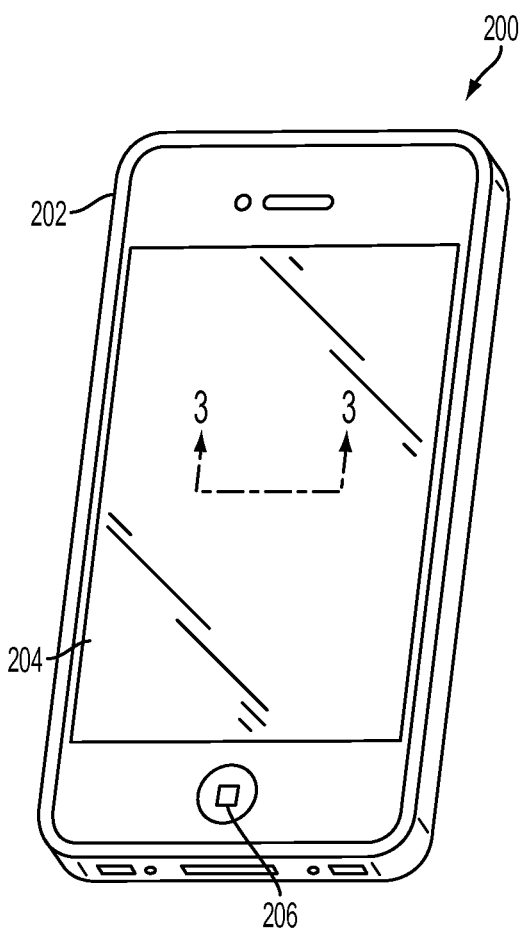
FIG. 2 depicts a perspective view of one example of an electronic device.

Referring now to FIG. 2, there is shown one example of an electronic device. In the illustrated embodiment, the electronic device 200 is implemented as a smart telephone. Other embodiments can implement the electronic device differently, such as, for example, as a computer, a tablet computing device, and an integrated circuit.

The electronic device 200 includes an enclosure 202 surrounding a display 204 and one or more buttons 206 or input devices. The enclosure 202 can form an outer surface or partial outer surface and protective case for the internal components of the electronic device 200, and may at least partially surround the display 204. The enclosure 202 can be formed of one or more components operably connected together, such as a front piece and a back piece. Alternatively, the enclosure 202 can be formed of a single piece operably connected to the display 204.

The display 204 can be implemented with any suitable display, including, but not limited to, a multi-touch capacitive sensing touchscreen device that uses liquid crystal display (LCD) technology, organic light-emitting display (OLED) technology, or organic electro luminescence (OEL) technology. The button 206 can take the form of a home button, which may be a mechanical button, a soft button (e.g., a button that does not physically move but still accepts inputs), an icon or image on a display, and so on. Further, in some embodiments, the button 206 can be integrated as part of a cover glass of the electronic device.

Figure 3:
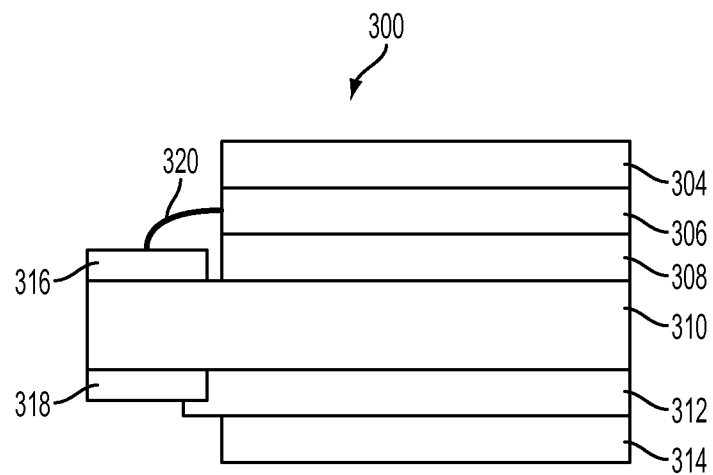
FIG. 3 illustrates a simplified cross-sectional view of the display 104 taken along line 3-3 in FIG. 2.

FIG. 3 illustrates a cross-section view of the display taken along line 3-3 in FIG. 2. The layers of a display stack 300 include the layers that constitute the display 204. For example, a top layer in the display stack 300 can be a cover glass (not shown) that is disposed over a front polarizer 304. The front polarizer 304 is disposed over a front transparent conductive layer 306, such as, for example, an ITO layer. The front transparent conductive layer 306 is disposed over a color filter layer 308 that is disposed over a display layer 310. The front transparent conductive layer 306 may, for example, provide electrostatic protection to prevent electrical discharge into the display.

The display layer 310 may take a variety of forms, including a LCD, a LED display, and an OLED display. In many embodiments, the display layer may be formed from glass or have a glass substrate. A back transparent conductive layer 312 is below the display layer 310. The back transparent conductive layer 312 is disposed over a back polarizer 314. The back transparent conductive layer may serve to prevent noise from entering the system through the display stack and thus may function as an isolation plane. In alternative embodiments, one or both of the conductive layers may have other functions and/or other layers, elements and the like, and may be part of the display stack 300.

Since certain layers, elements or the like located on one or both sides of the display layer 310 may require an electrical signal (or the same electrical signal), it may be useful to place electrical contacts in close proximity to one another but on opposing sides of a substrate. In order to do so, front and back conductive contacts 316, 318 may be provided. The front conductive contact 316 is disposed on a front surface of the display layer 310 and a back conductive contact 318 is disposed on an opposing back surface of the display layer 310. The conductive contacts 316, 318 can be implemented with any suitable conductive material and formation, including, but not limited to, contact pads, flexible cable connectors, and conductive traces.

An electrical connector 320 may electrically connect the front transparent conductive layer 306 to the front conductive contact 316. The back transparent conductive layer 312 may be electrically connected to the back conductive contact 318 in the illustrated embodiment. Embodiments described herein may provide structures and methods for electrically connecting the back conductive contact 318 to the front conductive contact 316, thereby allowing a signal or signals to be transmitted to or from the back conductive contact 318 using the front conductive contact 316. In the illustrated embodiment, a signal or signals transmitted to the front conductive contact 316 can be transmitted to the front and back transparent conductive layers 306, 312 because the front conductive layer 306 is electrically connected to the front conductive contact 316 using electrical connector 320 and the back conductive contact 318 is electrically connected to the front conductive contact 316 using the techniques and methods described in more detail herein. It should be appreciated that the front and back conductive contacts 316, 318 may likewise provide electrical connections to additional layers or elements of the electronic device, or may provide such connections instead of providing connections to either of the conductive layers 306, 312.

Those skilled in the art will recognize that other components or devices can be disposed on the display layer 310. By way of example only, one or more integrated circuits (not shown) can be disposed on the display layer 310. In some embodiments, the other components, including the conductive contacts, can be disposed in an area on the display layer 310 that extends into a region that is not visible by a user viewing the display of the electronic device. For example, when the electronic device is a smartphone or a tablet computing device, the other components and the conductive contacts are disposed on the display layer in an area that is covered by a black mask layer.

The front and back polarizers 304, 314 can be implemented in any suitable form and can include polarizers that are known and used in the art. Additionally, the color filter layer 308 can be implemented in any suitable form and can include a color filter layer that is known and used in the art.

Figure 4:
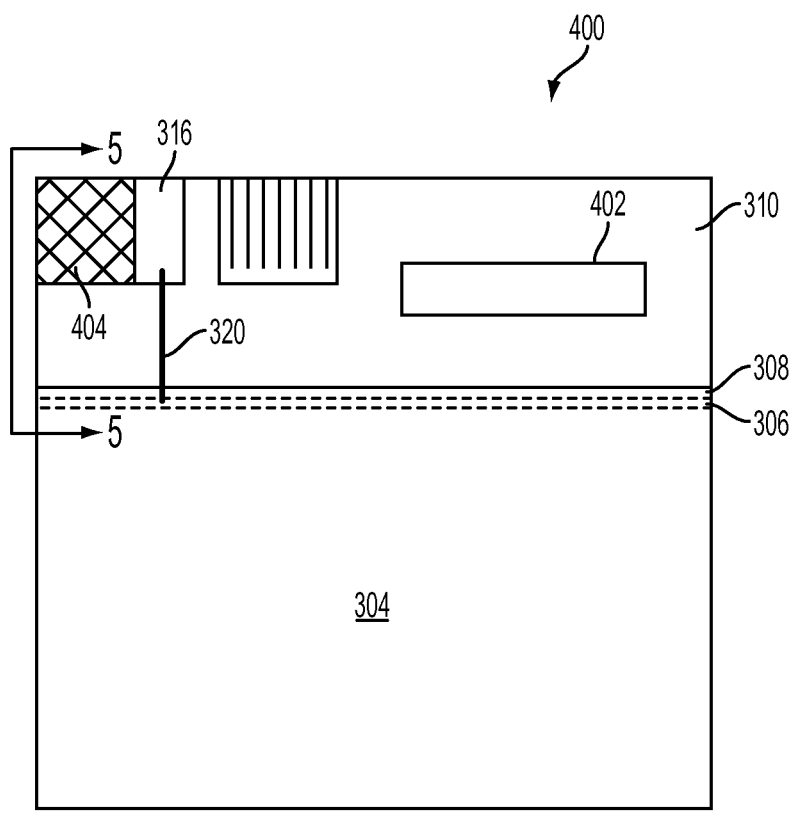
FIG. 4 depicts a top view of the display layer 310 shown in FIG. 3 and one example of an electrical connection to the electrical contact 316.

Referring now to FIG. 4, there is shown a top view of the display layer 310 shown in FIG. 3 and one example of an electrical connection to the front conductive contact 316. Display layer 310 includes the front conductive contact 316, a flexible cable connector 400, and one or more integrated circuits 402. A conductive material 404 is disposed on at least a portion of the front conductive contact 316. The conductive material can be implemented with any suitable conductive material or combination of materials, including, but not limited to, metal, silver nanowire, and conductive nanoparticles.

Figure 5:
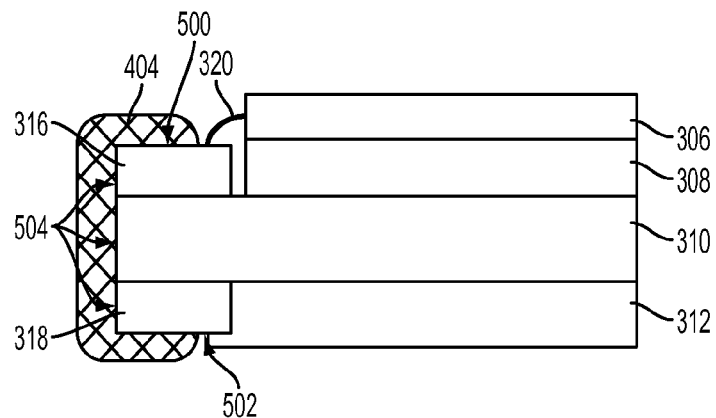
FIG. 5 illustrates a cross-sectional view of the substrate and electrical connection taken along line 5-5 in FIG. 4.

FIG. 5 illustrates a cross-section view of the display layer 310 and the electrical connection taken along line 5-5 in FIG. 4. The front polarizer 304 is not shown for simplicity. The conductive material 404 is disposed over at least a portion of the front surface 500 of the front conductive contact 316 and the back surface 502 of the back conductive contact 318. The conductive material is also disposed over the surfaces 504 between the front and back surfaces 500, 502 of the front and back conductive contacts 316, 318.

Figure 6:
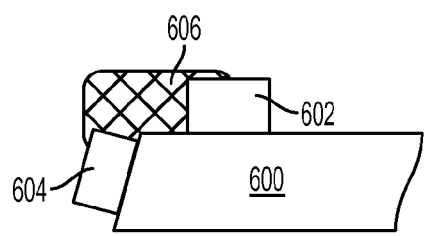
FIG. 6 depicts an example of a substrate with conductive contacts on different surfaces.

The surfaces of the conductive contacts in which the conductive material is disposed over are called contact surfaces. When the conductive material 404 is disposed over the front surface 500 of the front conductive contact 316 and the back surface 502 of the back conductive contact 318 when an electrical connection is formed, some of the contact surfaces (i.e., 500, 502) are oriented in opposite directions and the other contact surfaces are oriented in the same direction. In other embodiments, all or some of the contact surfaces can be oriented in the same directions or in different (opposite and non-opposite) directions. FIG. 6 depicts an example of a substrate 600 with two conductive contacts 602, 604 on different surfaces. The conductive material 606 is disposed over multiple contact surfaces with all of the contact surfaces of the conductive contacts oriented in different directions.

Returning to FIG. 5, since the back transparent conductive layer 312 is electrically connected to the back conductive contact 318, the back transparent conductive layer 312 is also electrically connected to the front conductive contact 316 through the conductive material 404. A signal can be transmitted to or from the back transparent conductive layer 312 using the front conductive contact 316, the conductive material 404, and the back conductive contact 318. For example, unused existing electrical connections to front conductive contact 316 can be used to transmit a signal to the back transparent conductive layer 312 using conductive material 404 and back conductive contact 318. Alternatively, a new electrical connection to the front conductive contact 316 can be added to the device and used to transmit a signal to or from the back transparent conductive layer 312 using conductive material 404 and back conductive contact 318.

The conductive material 404 can be configured or shaped into any desired shape or thickness. For example, the conductive material 404 can be formed at a thickness or a shape that results in the conductive material consuming less area in an electronic device compared to the flexible cable 108 in FIG. 1. Flexible cables may come in different thicknesses and widths, but flexible cables are substantially fixed in a shape and limited in part by a bend radius when connected to the conductive contacts 100, 104.

In some embodiments, the back transparent conductive layer 312 can be implemented with a material, or combination of materials, that has a higher than desired impedance. For example, when the back transparent conductive layer 312 is formed with ITO, the impedance across the surface of the layer 312 can be an issue when biasing the back transparent conductive layer 312. The resistance to the center of the layer 312 generally is higher than the resistance at an edge of the back transparent conductive layer 312, which can result in signal non-uniformity across the surface of the layer 312.

Figure 7:
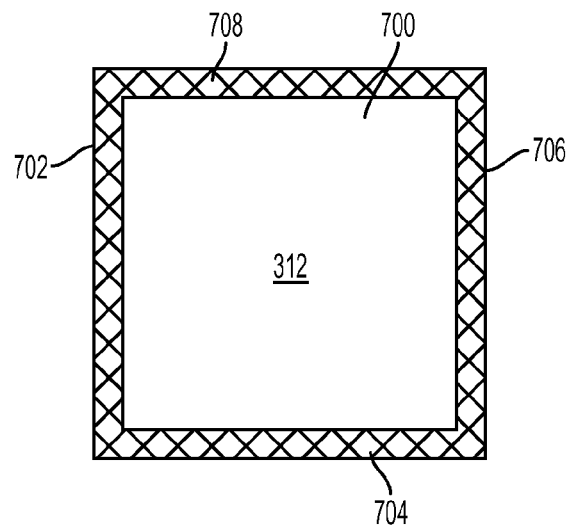
FIG. 7 illustrates an example of a bottom surface of a conductive layer.

FIG. 7 illustrates one implementation for improving signal transmission across the surface of the back transparent conductive layer 312 in certain embodiments. A back surface 700 of the back transparent conductive layer 312 is shown in FIG. 7. Conductive borders 702, 704, 706, 708 are disposed on the perimeter edges of the back surface of the back transparent conductive layer 312. The conductive borders 702, 704, 706, 708 cooperate to form a conductive frame around the perimeter edges of the layer 312 in the illustrated embodiment. The conductive frame transmits the signal around the perimeter edges to improve signal uniformity across the surface of the back transparent conductive layer 312.

The conductive border or borders can be formed using any suitable material or combination of materials that has a lower impedance than the material(s) used to form the transparent back conductive layer 312. A conductive border or borders can be opaque or transparent. A conductive border or borders can be formed prior to forming the back transparent conductive layer 312. Alternatively, a conductive border or borders can be formed after the formation of the back transparent conductive layer 312.

The conductive border or borders can be formed on the back transparent conductive layer 312 using any suitable fabrication method. By way of example only, the conductive border(s) can be deposited on the surface of the back transparent conductive layer 312. The conductive border(s) can be deposited using, for example, photolithography or screen printing. A mask can be used to mask off areas of the surface where the conductive border(s) is not to be formed. A conductive border can be used with, or in place of, the conductive material 404.

Additionally, those skilled in the art will recognize that other embodiments are not limited to the conductive frame. One or more conductive borders, of any given design or shape, can be formed on the back transparent conductive layer. Additionally, one or more conductive borders or shapes do not have to be continuous and unbroken. A conductive border can be formed in any suitable shape or configuration.

Although the embodiment described in conjunction with FIGS. 3-7 describes a display layer and a back transparent conductive layer, other embodiments are not limited to this construction. Any type of substrate, such as glass, plastic, printed circuit board, or flexible cable, can be used in place of the display layer and the back transparent conductive layer. Various embodiments can include an electrical connection between two conductive contacts on a single substrate or an electrical connection between two conductive contacts on different substrates. The contact surfaces of the conductive contacts can be oriented in different directions or in the same direction. The different directions can assume any difference in direction. By way of example only, the different directions can be opposite (180 degrees), at an acute angle with respect to each other, or at an obtuse or reflex angle with respect to each other.

Figure 8:
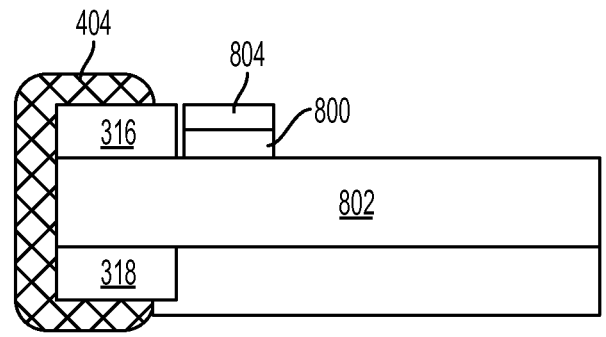
FIG. 8 depicts a cross-sectional view of another example of electrical connections.
Figure 9:
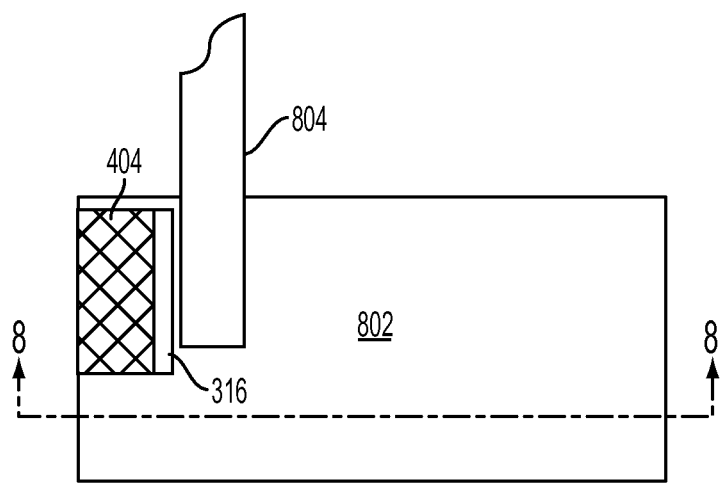
FIG. 9 illustrates a top view of the electrical connections shown in FIG. 8.

Referring now to FIG. 8, there is shown a cross-sectional view of another example of electrical connections. FIG. 9 depicts a top view of the electrical connections shown in FIG. 8. The conductive material 404 is disposed on at least a portion of the front conductive contact 316 and the back conductive contact 318 and, optionally, the surfaces between the conductive contacts. A first flexible cable connector 800 is disposed on the front surface of a substrate 802 and a second flexible cable 804 is connected to the first cable connector 800. The substrate 802 can be made of any suitable material or combination of materials including, but not limited to, glass, plastic, and flexible cable. The flexible cable 804 can be implemented with any suitable flexible cable, including, but not limited to, ribbon cable, flexible flat cable, flat panel cable, and flexible printed circuit. In other embodiments, the flexible cable 804 can be connected to the front conductive contact 316.

Figure 10:
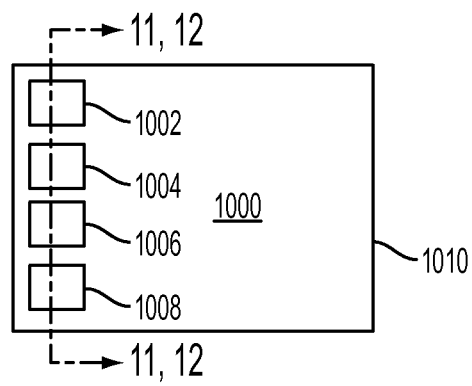
FIG. 10 depicts a top view of an example of conductive contacts on a substrate.

Referring now to FIG. 10, there is shown a top view of an example of conductive contacts on a substrate. The substrate 1000 can be made of any suitable material or combination of materials including, but not limited to, glass, plastic, and flexible cable. Conductive contacts 1002, 1004, 1006, 1008 are disposed on the front surface 1010 of the substrate 1000.

Figure 11:
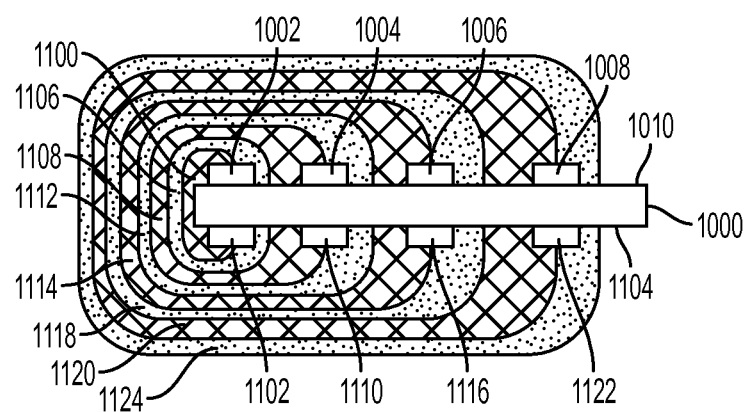
FIG. 11 illustrates a cross-sectional view of an example of electrical connections for the embodiment shown in FIG. 10.

FIG. 11 depicts a cross-sectional view of an example of electrical connections for the embodiment shown in FIG. 10. Conductive material 1100 electrically connects the conductive contact 1002 on the front surface 1010 of the substrate 1000 to a conductive contact 1102 on a back surface 1104 of the substrate 1000. Insulating material 1106 surrounds the conductive material 1100 to electrically isolate the electrical connection between the front and back conductive contacts 1002, 1102.

Conductive material 1108 electrically connects the conductive contact 1004 on the front surface 1010 of the substrate 1000 to a conductive contact 1110 on the back surface 1104 of the substrate 1000. Insulating material 1112 surrounds the conductive material 1108 to electrically isolate the electrical connection between the front and back conductive contacts 1004, 1110.

Conductive material 1114 electrically connects the conductive contact 1006 on the front surface 1010 of the substrate 1000 to a conductive contact 1116 on the back surface 1104 of the substrate 1000. Insulating material 1118 surrounds the conductive material 1114 to electrically isolate the electrical connection between the front and back conductive contacts 1006, 1116.

Conductive material 1120 electrically connects the conductive contact 1008 on the front surface 1010 of the substrate 1000 to a conductive contact 1122 on the back surface 1104 of the substrate 1000. Insulating material 1124 surrounds the conductive material 1120 to electrically isolate the electrical connection between the front and back conductive contacts 1008, 1122. Outer insulating material 1124 is optional and is not included in some embodiments in accordance with the invention. For example, a device can omit the outer insulating material 1124 when the electrical connection between front and back conductive contacts 1008, 1122 is connected to ground for electrostatic discharge (ESD) protection.

In the illustrated embodiment, the conductive material 1100, 1108, 1114, 1120 extends partially over the conductive contacts. In other embodiments, the conductive material can extend completely over the conductive contacts. Additionally, a different conductive material can be used to form each electrical connection or one or more electrical connections. For example, the conductive material 1114 can by of a different type than the other conductive materials 1100, 1108, and 1120. A different insulating material can also be used to isolate one or more electrical connections.

The electrical connections formed in the embodiment shown in FIG. 11 can be appropriate when only contact 1102 is near an edge of the substrate 1000 and the other conductive contacts 1110, 1116, 1122 are positioned closer and closer to the middle of the substrate 1000.

Figure 12:
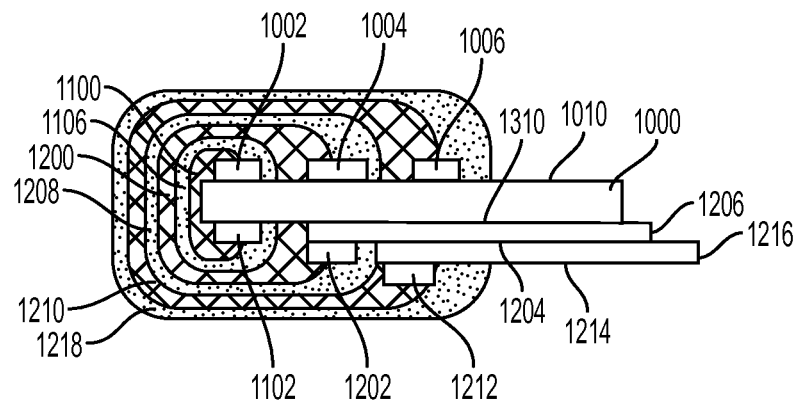
FIG. 12 depicts a cross-sectional view of another example of electrical connections for the embodiment shown in FIG. 10.

FIG. 12 illustrates a cross-sectional view of another example of electrical connections for the embodiment shown in FIG. 10. Only conductive contacts 1002, 1004, and 1006 are shown in FIG. 12 for simplicity. Conductive material 1100 electrically connects the conductive contact 1002 on the front surface 1010 of the substrate 1000 to the conductive contact 1102 on the back surface 1104 of the substrate 1000. Insulating material 1106 surrounds the conductive material 1100 to electrically isolate the electrical connection between the front and back conductive contacts 1002, 1102.

Conductive material 1200 electrically connects the conductive contact 1004 on the front surface 1010 of the substrate 1000 to a conductive contact 1202 on a back surface 1204 of another substrate 1206. The substrate 1206 is disposed below the substrate 1000. Insulating material 1208 surrounds the conductive material 1200 to electrically isolate the electrical connection between the front and back conductive contacts 1004, 1202.

Conductive material 1210 electrically connects the conductive contact 1006 on the front surface 1010 of the substrate 1000 to a conductive contact 1212 on a back surface 1214 of a substrate 1216. The substrate 1216 is disposed below the substrate 1206. Insulating material 1218 surrounds the conductive material 1210 to electrically isolate the electrical connection between the front and back conductive contacts 1006, 1212.

The conductive contact 1008 (not shown) can be electrically connected to a conductive contact on the back surface 1214 of the substrate 1216, or to a conductive contact on another substrate (not shown) that is disposed below the substrate 1216. The electrical connections formed in the embodiment shown in FIG. 12 can be appropriate when conductive contacts 1102, 1202, and 1212 are near an edge of each substrate. As discussed, the conductive contact 1008 can be electrically connected to a conductive contact positioned closer to the middle of the substrate 1216 or to a conductive contact positioned near an edge on a separate substrate disposed below the substrate 1216.

Figure 13:
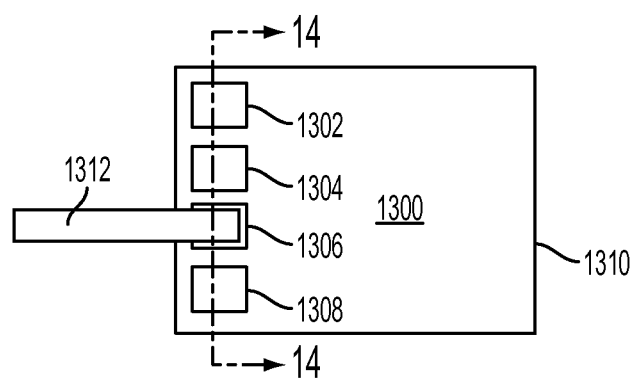
FIG. 13 illustrates a top view of an example of conductive contacts on a substrate.

Referring now to FIG. 13, there is shown a top view of an example of conductive contacts on a substrate. The substrate 1300 can be made of any suitable material or combination of materials including, but not limited to, glass, plastic, and flexible cable. Conductive contacts 1302, 1304, 1306, 1308 are disposed on the front surface 1310 of the substrate 1300. A flexible cable 1312 is connected to the conductive contact 1306. The conductive contact 1306 can be implemented, for example, as a cable connector or a conductive contact pad.

Figure 14:
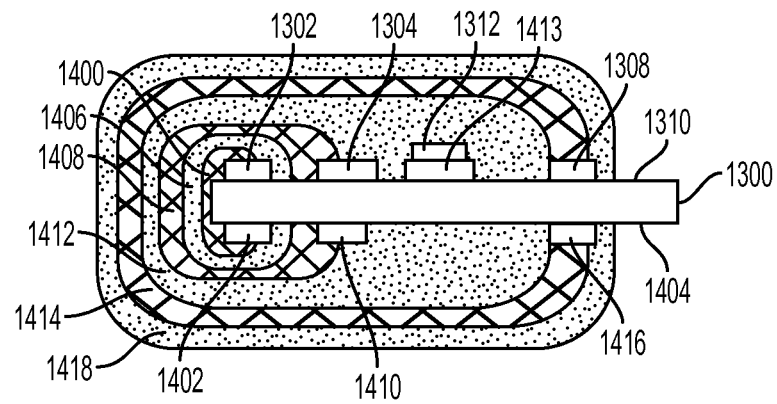
FIG. 14 depicts a cross-sectional view of an example of electrical connections for the embodiment shown in FIG. 13.

FIG. 14 depicts a cross-sectional view of an example of electrical connections for the embodiment shown in FIG. 13. Conductive material 1400 electrically connects the conductive contact 1302 on the front surface 1310 of the substrate 1300 to a conductive contact 1402 on a back surface 1404 of the substrate 1300. Insulating material 1406 surrounds the conductive material 1400 to electrically isolate the electrical connection between the front and back conductive contacts 1302, 1402.

Conductive material 1408 electrically connects the conductive contact 1304 on the front surface 1310 of the substrate 1300 to a conductive contact 1410 on the back surface 1404 of the substrate 1300. Insulating material 1412 surrounds the conductive material 1408 to electrically isolate the electrical connection between the front and back conductive contacts 1304, 1410. Insulating material 1412 also electrically isolates the electrical connection between the flexible cable 1312 and the conductive contact 1413.

Conductive material 1414 electrically connects the conductive contact 1308 on the front surface 1310 of the substrate 1300 to a conductive contact 1416 on the back surface 1404 of the substrate 1300. Insulating material 1418 surrounds the conductive material 1414 to electrically isolate the electrical connection between the front and back conductive contacts 1308, 1416. Outer insulating material 1418 is optional and is not included in some embodiments.

Figure 15:
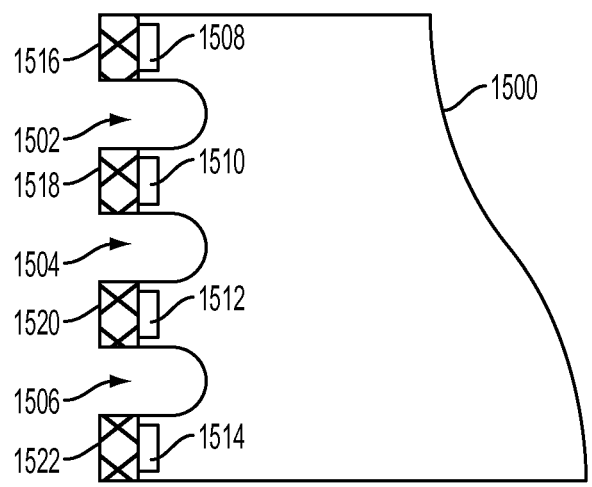
FIG. 15 illustrates a top view of a substrate and electrical connections.

FIG. 15 illustrates a top view of a substrate and electrical connections. The substrate 1500 can be fabricated in any shape or design. In the illustrated embodiment, the substrate 1500 has trenches 1502, 1504, 1506. The trenches produce substrate fingers or protrusions, and conductive contacts 1508, 1510, 1512, 1514 are disposed on the substrate fingers. Conductive material 1516, 1518, 1520, 1522 is disposed on at least a portion of a respective conductive contact.

Those skilled in the art will recognize that a substrate can be fabricated in any given shape. Shaping the substrate can result in an easier fabrication process for the conductive contacts or electrical connections. By way of example only, if the substrate fingers are dipped in a conductive material, the substrate fingers can reduce the likelihood that conductive material will be formed on the non-finger portion of the substrate.

Additionally, shaping the substrate can allow for different conductive materials to be used to form one or more electrical connections. The conductive contacts 1508, 1510, 1512, 1514 can be electrically connected to conductive contacts on multiple substrates or on a single substrate.

Figure 16:
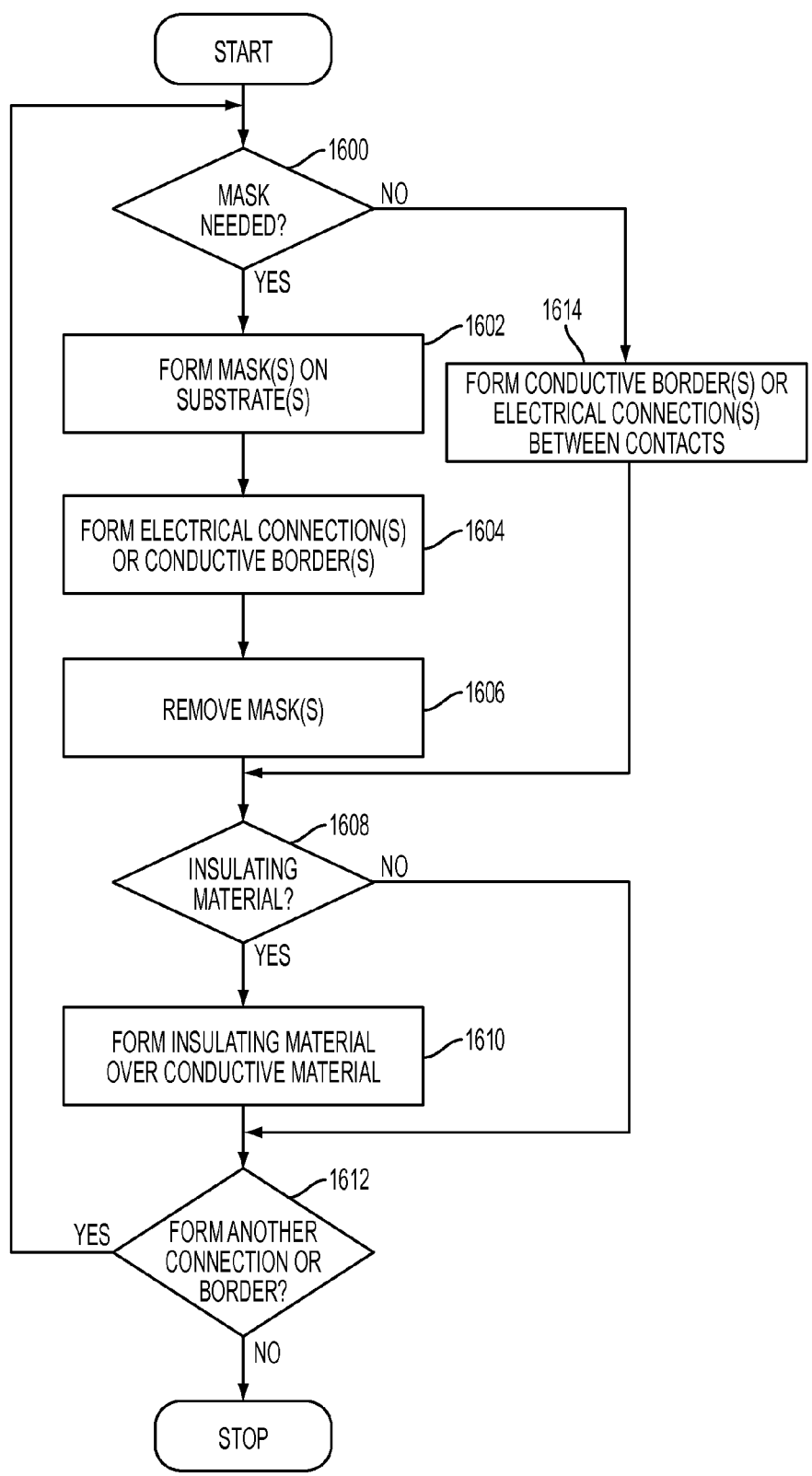
FIG. 16 is a flowchart of one example of a method for forming one or more electrical connections or conductive borders.

Referring now to FIG. 16, there is shown a flowchart of one example of a method for forming one or more electrical connections or conductive borders. Initially, a determination is made at block 1600 as to whether one or more masks is needed prior to forming a conductive border or borders on a surface of one or more substrates, or prior to forming an electrical connection or connections between conductive contacts. The mask(s) can be used to mask off previously formed components on or in a substrate, or areas of a surface or surfaces where an electrical connection or a conductive border(s) is not to be formed.

If one or more masks are needed, the method passes to block 1602 where the mask or masks are formed on the surface or surfaces of one or more substrates. The mask can be formed on the substrate(s) using any suitable fabrication method. The mask can include masks that are known and used in the art.

Next, as shown in block 1604, one or more electrical connections or conductive borders are formed. The electrical connection(s) or conductive border(s) can be formed, for example, by dipping the substrate or substrates in a conductive material. Alternatively, the one or more conductive borders or electrical connections can be formed by depositing conductive material on a surface or conductive contact. Examples of conductive materials include, but are not limited to, metal, organic materials, nanoparticles, or combinations thereof. By way of example only, a conductive border or electrical connection can be deposited using a chemical vapor deposition process or a physical vapor deposition process, such as sputtering.

The mask or masks can then be removed (block 1606) and a determination made at block 1608 as to whether insulating material is to be formed over the electrical connection(s). If so, the insulating material is formed over the electrical connection using any suitable method (block 1610). By way of example only, the insulating material can be deposited over the conductive material that forms the electrical connection.

It should be noted that a mask or masks can be used in conjunction with forming the insulating material over the electrical connection. The mask(s) is formed on the substrate prior to forming the insulating layer. The mask(s) can be used to mask off previously formed components on or in a substrate, or areas of a surface or surfaces where the insulating material is not to be formed. The mask(s) can be removed after the insulating layer has been formed.

A determination is then made at block 1612 as to whether another electrical connection or conductive border is to be formed. Another electrical connection can be formed between different conductive contacts on a single substrate, between different conductive contacts on multiple substrates, or a different type of electrical connection can be formed, such as, for example, a connection using flexible cable. If another electrical connection or conductive border is to be formed, the process returns to block 1600.

If a mask is not needed at block 1600, the process passes to block 1614 where a conductive border or borders, or an electrical connection(s) is formed. The electrical connection(s) or conductive border(s) can be formed, for example, by dipping the substrate or substrates in a conductive material. Alternatively, the one or more conductive borders or electrical connections can be formed by depositing conductive material on a surface or conductive contact. Examples of conductive materials include, but are not limited to, metal, organic materials, nanoparticles, or combinations thereof. The method then passes to block 1608.

Various embodiments have been described in detail with particular reference to certain features thereof, but it will be understood that variations and modifications can be effected within the spirit and scope of the disclosure. For example, the embodiments described in conjunction with FIGS. 3-9 are not limited to a display layer and a back transparent conductive layer. Electrical connections between two conductive contacts having contact surfaces that are oriented in different directions and disposed on any substrate or substrates, including, but not limited to, metal, plastic, glass, or printed circuit boards, can use embodiments described herein. Additionally or alternatively, embodiments can have or form an electrical connection between three or more conductive contacts.

And even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

What is claimed is:

1. An electronic device, comprising:
   a first conductive contact disposed on a first surface of a substrate and a second conductive contact disposed on a different second surface of the substrate; and
   a conductive material disposed on at least a portion of the first and second conductive contacts and on at least a portion of an intervening edge of the substrate between each contact surface of the conductive contacts to electrically connect the first and second conductive contacts, wherein the contact surface of the first conductive contact is oriented in a first direction and the contact surface of the second conductive contact is oriented in a different second direction.

2. The electronic device as in claim 1, wherein the first direction and the second direction are opposite directions.

3. The electronic device as in claim 1, wherein the conductive material comprises one of a metal, silver nanowire, and conductive nanoparticles.

4. An electronic device, comprising:
   a first substrate including a first conductive contact disposed on a surface of the first substrate; a second substrate disposed below the first substrate and including a second conductive contact disposed on a surface of the second substrate; and
   a conductive material disposed on at least a portion of the first and second conductive contacts and on at least a portion of an intervening edge of at least one of the first or second substrates between each contact surface of the first and second conductive contacts to electrically connect the first and second conductive contacts, wherein a contact surface of the first conductive contact and a contact surface of the second conductive contact are oriented in different directions.

5. The electronic device as in claim 4, wherein the first conductive contact is disposed on a front surface of the first substrate and the second conductive contact is disposed on a back surface of the second substrate.

6. The electronic device as in claim 5, wherein the first substrate comprises a display layer and the second substrate comprises a transparent conductive layer.

7. The electronic device as in claim 5, further comprising a flexible cable connected to a flexible cable connector disposed on the front surface of the first substrate.

8. The electronic device as in claim 4, wherein the conductive material comprises one of a metal, silver nanowire, and conductive nanoparticles.

9. A method for forming an electrical connection between conductive contacts disposed on different surfaces of one or more substrates, the method comprising forming a conductive material on at least a portion of the conductive contacts and on at least a portion of an intervening edge of at least one of the one or more substrates between each contact surface of the conductive contacts by dipping the conductive contacts and the intervening edge of the at least one of the one or more substrates between the contact surfaces of the conductive contacts into the conductive material.

10. The method as in claim 9, further comprising forming insulating material over the conductive material to isolate the electrical connection.

11. The method as in claim 9, further comprising forming one or more conductive borders on a portion of a surface of at least one substrate.

12. The method as in claim 11, wherein at least one conductive border is formed along a perimeter edge of the at least one substrate.

13. The method as in claim 9, wherein one conductive contact is disposed on a front surface of a first substrate and the other conductive contact is disposed on a back surface of the first substrate.

14. An electronic device, comprising:
   a first conductive layer disposed over a display layer;
   a first conductive contact disposed adjacent an edge of a top surface of the display layer;
   a second conductive contact disposed adjacent an edge of a bottom surface of the display layer;
   a conductive material disposed on at least a portion of the first and second conductive contacts and on at least a portion of an intervening edge of the display layer between each contact surface of the first and second conductive contacts to electrically connect the first and second conductive contacts;
   an electrical connector connected between the first conductive layer and the first conductive contact to electrically connect the first conductive contact to the first conductive layer; and
   a second conductive layer disposed below the display layer and electrically connected to the second conductive contact, wherein the first conductive layer is electrically connected to the second conductive layer through the electrical connector connected between the first conductive layer and the first conductive contact and the conductive material disposed on at least the portion of the first and second conductive contacts and the intervening edge of the display layer.

15. The method as in claim 14, further comprising one or more conductive borders formed along a perimeter edge of at least one of the first conductive layer or the second conductive layer.

16. The electronic device as in claim 14, wherein the conductive material comprises one of a metal, silver nanowire, and conductive nanoparticles.

17. The electronic device as in claim 14, wherein the edge of the display layer is shaped to include a protrusion, and the first conductive contact is disposed on the top surface of the protrusion and the second conductive contact is disposed on the bottom surface of the protrusion.

* * * * *